(12) United States Patent
Li et al.

(10) Patent No.: US 12,464,665 B1
(45) Date of Patent: Nov. 4, 2025

(54) ELECTRONIC PRODUCT STORAGE DEVICE WITH STORAGE BOX

(71) Applicant: Qizheng Li, Shenzhen (CN)

(72) Inventors: Qizheng Li, Shenzhen (CN); Debing Ouyang, Shenzhen (CN)

(73) Assignee: Qizheng Li, Shenzhen (CN)

( * ) Notice: Subject to any disclaimer, the term of this patent is extended or adjusted under 35 U.S.C. 154(b) by 0 days.

(21) Appl. No.: 19/237,054

(22) Filed: Jun. 13, 2025

(30) Foreign Application Priority Data

| | | |
|---|---|---|
| Jun. 15, 2024 | (CN) | 202421363512.X |
| Jun. 15, 2024 | (CN) | 202421363545.4 |
| May 26, 2025 | (CN) | 202510684285.3 |
| May 26, 2025 | (CN) | 202521048199.5 |

(51) Int. Cl.
| | |
|---|---|
| *H04R 1/10* | (2006.01) |
| *A61J 1/03* | (2023.01) |
| *H05K 5/00* | (2006.01) |
| *H05K 5/02* | (2006.01) |
| *H05K 5/03* | (2006.01) |

(52) U.S. Cl.
CPC ............. *H05K 5/0221* (2013.01); *A61J 1/03* (2013.01); *H05K 5/0086* (2013.01); *H05K 5/0247* (2013.01); *H05K 5/03* (2013.01); *H04R 1/1025* (2013.01)

(58) Field of Classification Search
None
See application file for complete search history.

(56) References Cited

U.S. PATENT DOCUMENTS 11,128,966 B2 * 9/2021 Ayache ................ H04R 1/1025

* cited by examiner

*Primary Examiner* — Xanthia C Relford
(74) *Attorney, Agent, or Firm* — Jose Cherson Weissbrot

(57) ABSTRACT

Disclosed is an electronic product storage device with a storage box, which includes a compartment body for storing an electronic product and a storage box for storing articles, where the compartment body includes an upper housing and a lower housing which can be opened or closed to each other, an accommodating cavity for placing the electronic product is formed between the upper housing and the lower housing, and the lower housing is formed with a storage cavity for placing the storage box; a self-locking mechanism is provided between the storage box and the compartment body. Based on people's reliance on electronic devices, it enables people to reduce the likelihood of forgetting to carry essential items. Additionally, with the storage box provided within the storage cavity, this configuration maintains the storage box in a concealed state, thereby effectively protecting user privacy.

10 Claims, 13 Drawing Sheets

B-B

ELECTRONIC PRODUCT STORAGE DEVICE WITH STORAGE BOX

TECHNICAL FIELDS

The present invention relates to the technical field of smart electronic products, and in particular to an electronic product storage device with a storage box.

BACKGROUND ART

With the development of technology, people increasingly rely on smart electronic products such as smartphones, wireless earphones, smart wristbands, and smart rings. Due to this reliance, people constantly carry these smart electronic products, but personal items, namely small-sized articles such as medications, keys, or earrings are prone to being forgotten or lost during carrying. Additionally, due to heightened awareness of privacy, particularly for items like medications, it is undesirable for others to see them during outdoor use.

No existing technology has provided a smart electronic product storage device that is both convenient for carrying personal items and sufficiently concealed to thereby protect user privacy.

SUMMARY OF THE INVENTION

In order to solve the above-mentioned problems of the background, the present invention provides an electronic product storage device with a storage box, which can be used to carry small-sized items and protect the privacy of a user.

The solution taken by the present invention to solve the technical problem thereof is an electronic product storage device with a storage box, which includes a compartment body for storing an electronic product and a storage box for storing articles, where the compartment body includes an upper housing and a lower housing which can be opened or closed to each other, an accommodating cavity for placing the electronic product is formed between the upper housing and the lower housing, and the lower housing is formed with a storage cavity for placing the storage box;

a self-locking mechanism is provided between the storage box and the compartment body, and when the storage box is placed in the cavity, the self-locking mechanism locks the compartment body and the storage box, and when the self-locking mechanism is unlocked, the storage box can extend out of the cavity of the electronic product storage box;

the lower housing is provided with a control main board with a Hall switch, the storage box is provided with a magnetic element, the Hall switch on the control main board senses proximity or separation of the magnetic element, and outputs a low level or a high level for judging a state of whether the storage box is inserted into or removed from the cavity;

or, the storage box is provided with a control main board with a Hall switch, the lower housing is provided with a magnetic element, the Hall switch on the control main board senses proximity or separation of the magnetic element, and outputs a low level or a high level for judging a state of whether the storage box is inserted into or removed from the cavity;

By using the above-mentioned technical solution, a storage device for storing a portable electronic device and a storage box for storing articles are combined, based on people's reliance on electronic devices, this configuration enables users to reduce the likelihood of forgetting to carry essential items. Additionally, with the storage box provided within the cavity of the main body of the storage device, the self-locking mechanism effectively prevents accidental disengagement of the storage box from the compartment body. In this arrangement, the concealment of the storage box is facilitated, thereby effectively protecting user privacy. Simultaneously, through magnetic element and Hall switch sensing, high/low-level signals are transmitted to confirm whether the storage box is in a locked or unlocked state, allowing the user to perceive the status more intuitively.

Preferably, the lower housing includes a base outer shell and a base inner shell, the accommodating cavity is located between the base inner shell and the upper housing, the storage cavity is located in the base outer shell and located below the base inner shell, and the self-locking mechanism is located between the base outer shell and the storage box.

By using the above-mentioned technical solution, when the upper housing is opened, the electronic product is displayed outside, and the storage box is still hidden, further improving the privacy protection of the whole storage device for the contents in the storage box.

Preferably, the self-locking mechanism includes a self-locking buckle and a buckle structure that can interlock or unlock with each other, the buckle structure is provided on the storage box, the self-locking buckle has one end fixedly mounted on the compartment body as a fixed end and the other end as a free end, the buckle structure is provided with a hanging buckle protrusion, the free end and the hanging buckle protrusion can be engaged or disengaged with each other, and an energy storage spring is connected to the self-locking buckle, and when the self-locking buckle and the buckle structure are in a box-locked state, the energy storage spring is pressed by the buckle structure to be in a compressed state.

By using the above-mentioned technical solution, the self-locking mechanism can achieve locking or unlocking by means of a mechanical structure, the production and manufacturing costs are relatively low, and the operation is relatively convenient, and the storage box can be pressed once to lock, and then pressed once to unlock.

Preferably, the storage box or/and the compartment body are provided with a display screen, and the display screen and the control main board are electrically connected to display whether the storage box and the lower housing are in a locked state or an unlocked state.

Preferably, the control main board is provided with a main control module, a charging management module for supplying power to the electronic product, a signal transmission and reception module, and is provided with one or any combination of an electric quantity detection module, a buzzer, a vibration motor, an LED lamp, a button, a display screen, and an accumulator.

By using the above-mentioned technical solution, the whole storage device has the advantages of being multifunctional and smarter, and can facilitate the use of the user to a greater extent.

Preferably, the control main board is provided with a Bluetooth module or/and an NFC module, and the Bluetooth module or/and the NFC module are electrically connected to the signal transmission and reception module.

By using the above-mentioned technical solution, electrical signal connection between the device and an external terminal device, such as mobile phones, tablets, and laptops, etc. can be achieved via a Bluetooth module or/and an NFC module, and manipulation and control of the storage device can be achieved in APP, H5 pages and web pages.

Preferably, the base inner shell is formed with a recess for storing a portable electronic device, and a shape of the recess matches a shape of the portable electronic device.

By using the above-mentioned technical solution, the electronic product can be stably placed in the recess.

Preferably, the storage box is a medicine box, the medicine box includes an open-ended medicine box housing, the medicine box housing is formed with a medicine storage module, a medicine box partition plate detachably connected to the medicine box housing is provided inside the medicine storage module, and the medicine box partition plate divides a space inside the medicine storage module into at least two different medicine storage areas.

Preferably, the medicine storage module includes a first medicine storage module and a second medicine storage module, the medicine box partition plate includes a first medicine box partition plate dividing the first medicine storage module into at least two medicine storage areas, and a second medicine box partition plate dividing the second medicine storage module into at least two medicine storage areas; and an intermediate area is also provided between the first medicine storage module and the second medicine storage module and can be used for placing a medicine or medicine box partition plate.

By using the above-mentioned technical solution, it is particularly applicable to some people who take medicine but are unwilling to let others know, or people who are easy to forget to take medicine, and can place different medicines in different areas, so that the medicine can be used more cleanly and hygienically.

The present invention integrates an electronic product, an electronic product charging box, a control main board and a storage box together in a limited space, and has advantages of compact structure, small size, strong privacy protection, etc. and is particularly suitable for people who have privacy protection requirements like long-term medicine consumption, and people who are easy to lose small articles.

Preferably, a mechanical locking structure for preventing accidental opening of the self-locking mechanism is provided between the self-locking buckle and the storage box main body, and the mechanical locking structure includes a push button, and a linkage connected to the push button in a linkage manner, the linkage is provided with an abutment portion capable of forming an abutment connection with the storage box main body following sliding movement of the push button, and the base outer shell is provided with a push button mounting hole, and the push button is provided in the push button mounting hole.

By using the above-mentioned technical solution, by pushing the push button, the push button drives the linkage to move until the linkage forms an abutment connection with the storage box main body, and at this time, when the storage box main body is pressed, the free end cannot be separated from the hanging buckle protrusion, so as to prevent the storage box main body from being opened due to the storage box main body being accidentally pressed; and if it is necessary to unlock the self-locking mechanism, it is only necessary to pull the push button to drive the linkage to be separated from the abutment connection with the storage box main body.

The foregoing description is merely an overview of the technical solution of the present invention. To enable clearer understanding of the technical means of the present invention, implementation may be carried out in accordance with the contents of the specification. Furthermore, to render the aforementioned and other objectives, features, and advantages of the present invention more apparent and comprehensible, preferred embodiments are specifically enumerated below in conjunction with the accompanying drawings, with detailed descriptions provided as follows.

Figure 1:
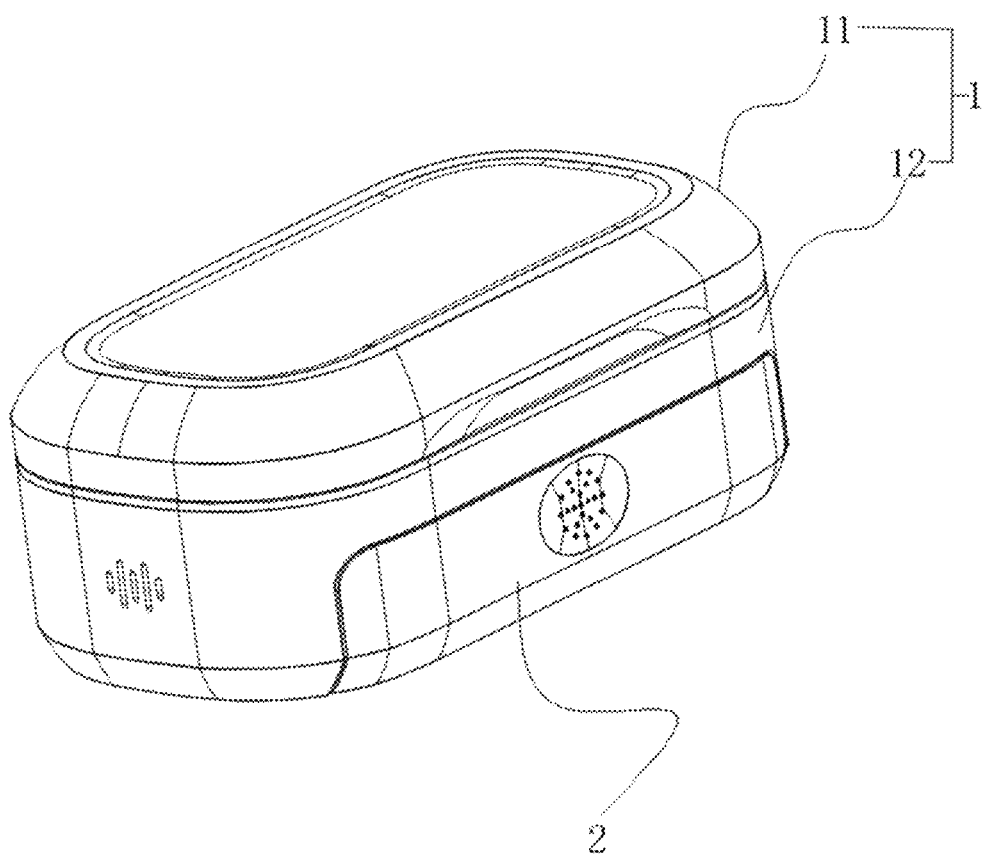
FIG. 1 is a schematic structural diagram showing an electronic product storage device with a storage box.
Figure 2:
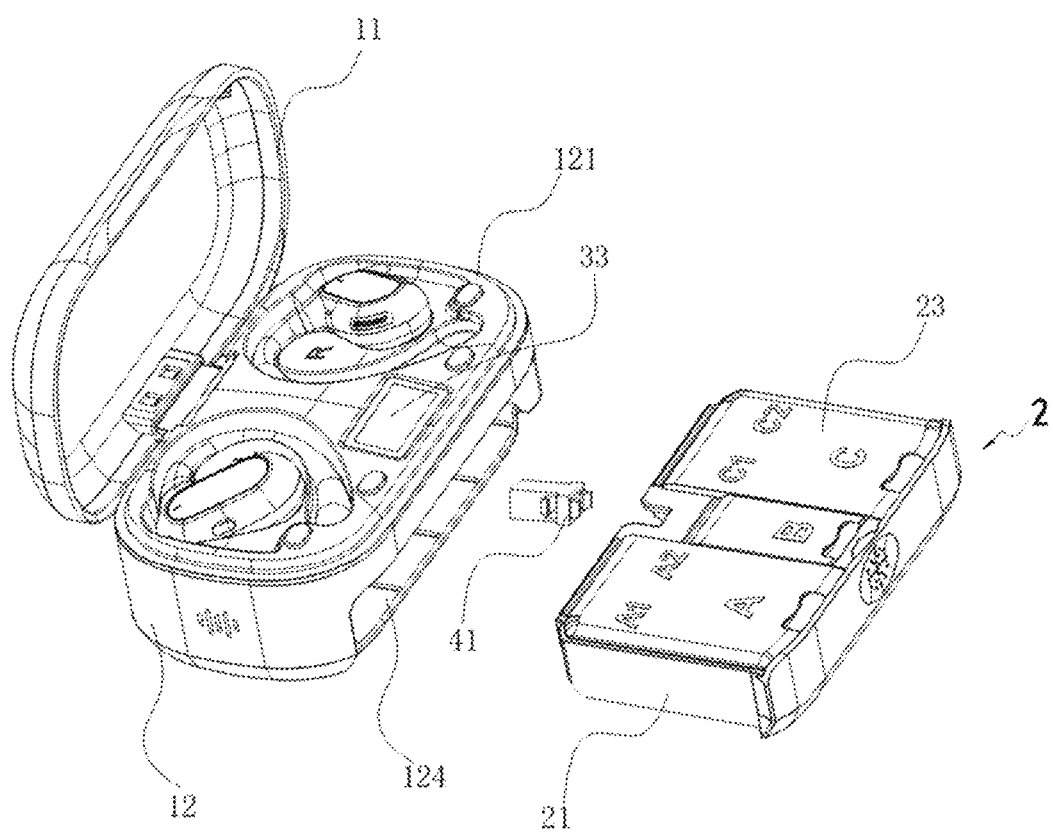
FIG. 2 is a first structural exploded view showing an electronic product storage device with a storage box according to the present invention.
Figure 3:
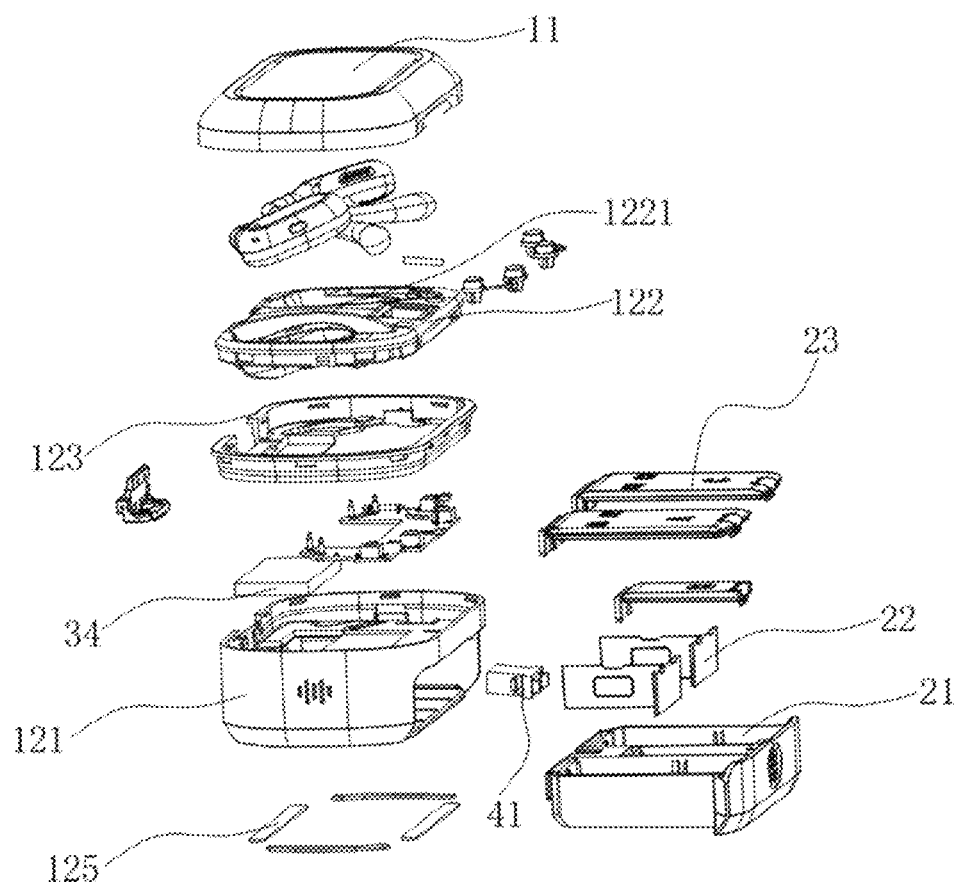
FIG. 3 is a second structural exploded view showing an electronic product storage device with a storage box according to the present invention.
Figure 4:
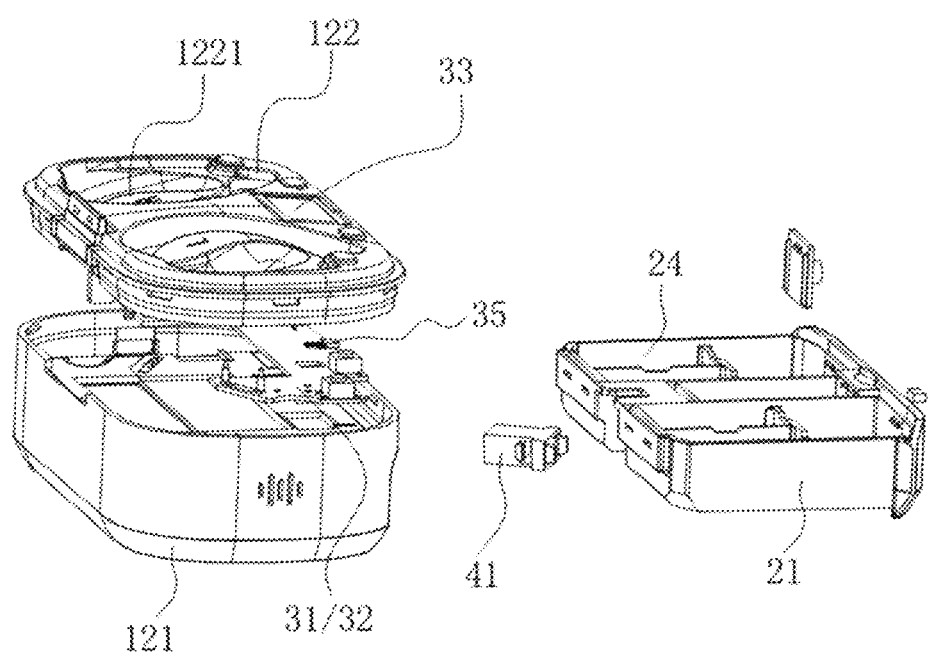
FIG. 4 is a third structural exploded view showing an electronic product storage device with a storage box according to the present invention.
Figure 5:
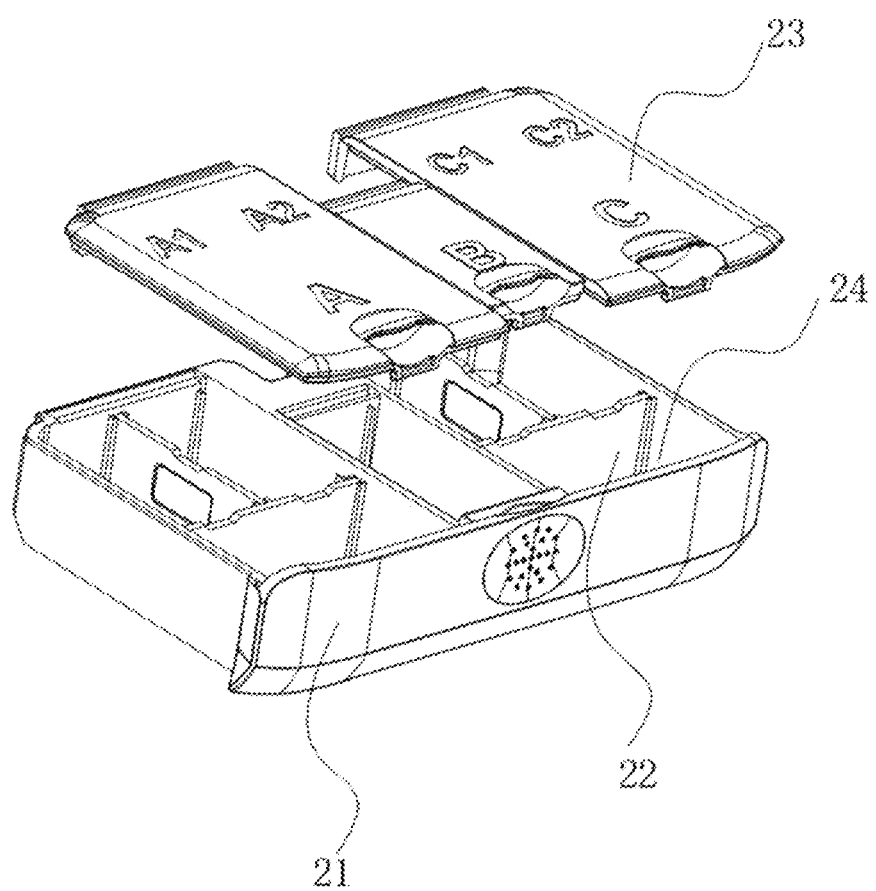
FIG. 5 is an exploded schematic diagram showing a storage box.
Figure 6:
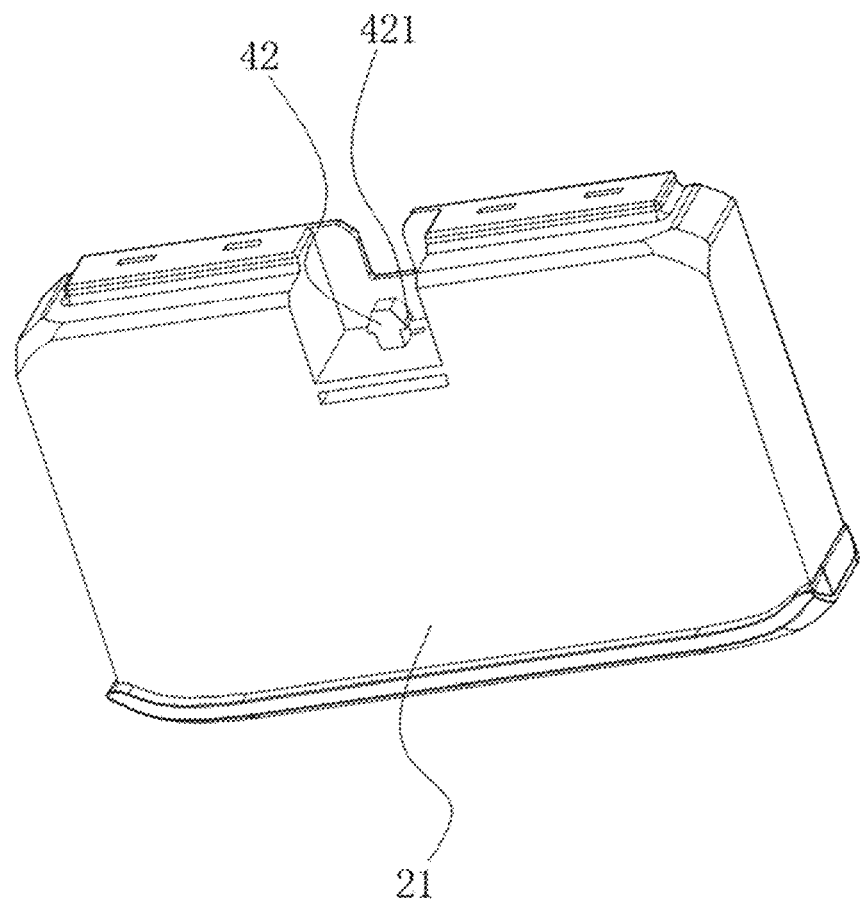
FIG. 6 is a bottom view showing a storage box.
Figure 7:
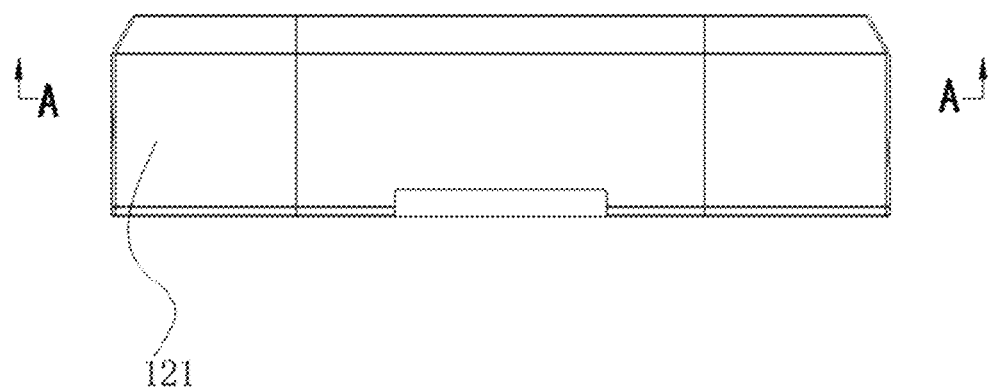
FIG. 7 is a schematic structural diagram showing a lower housing (in this case, a first storage box is mounted inside)
Figure 8:
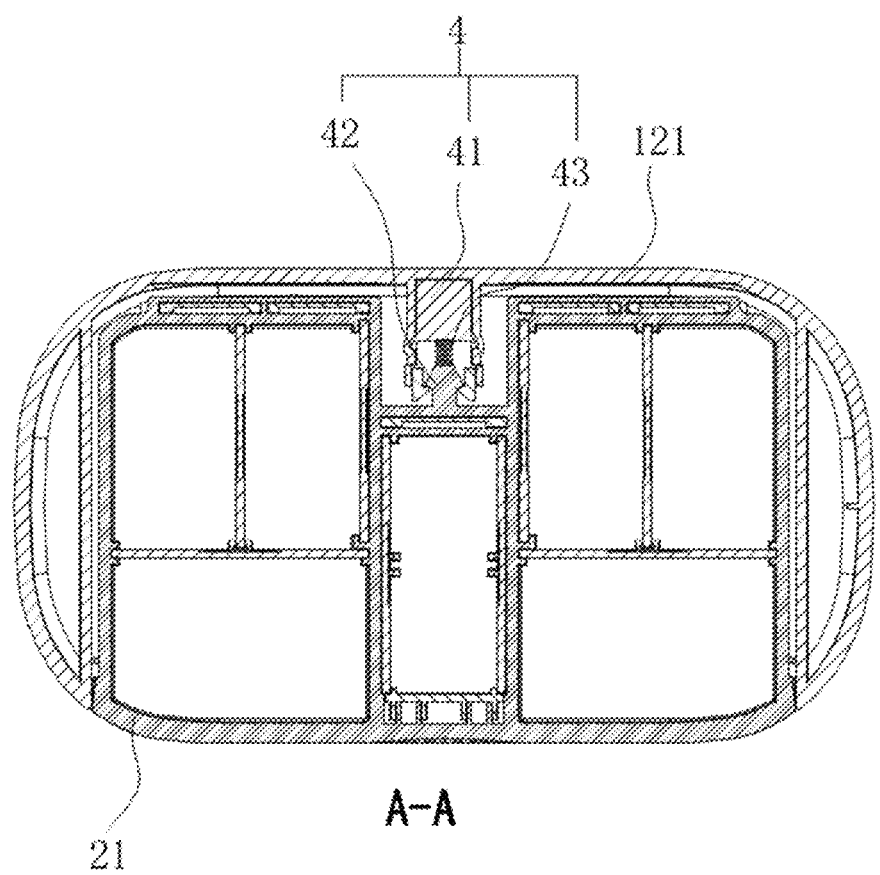
FIG. 8 is a sectional view taken along a line A-A of FIG. 7.

In the figure: 1. compartment body; 11. upper housing; 12. lower housing; 121. base outer shell; 122. base inner shell; 1221. recess; 123. base housing trim; 124. storage cavity; 125. support foot pad; 126. push button mounting hole;

2. storage box; 21. storage box main body; 22. partition plate; 221. clamping portion; 23. cover plate; 24. storage area; 25. spoon;

31. control main board; 32. control main board; 33. display screen; 34. accumulator; 35. Hall switch;

4. self-locking mechanism; 41. self-locking buckle; 42. buckle structure, 421. hanging buckle protrusion; 43. energy storage spring;

51. push button; 52. linkage; 53. abutment portion.

DETAILED DESCRIPTION OF THE INVENTION

To enable the content of the present invention to be more readily and clearly understood, the following further explains the invention with reference to specific embodiments and in conjunction with the accompanying drawings.

It should be noted that the orientation or positional relationships indicated by terms such as "center," "upper," "lower," "front," "rear," "left," "right," "inner," "outer," etc., are based on the orientation or positional relationships shown in the accompanying drawings. These terms are used solely to facilitate the description of the present invention and simplify the explanation, rather than to indicate or imply that the referenced devices or components must have specific orientations or be constructed and operated in specific orientations. Therefore, they should not be construed as limiting the present invention. Unless otherwise stated, the term "a plurality of" means two or more.

Unless explicitly defined or limited otherwise, the terms "mounted," "connected," and "coupled" shall be interpreted broadly. For example, a connection may be a fixed connection, a detachable connection, or an integral connection; it may be a mechanical connection, an electrical connection, or a direct connection; it may also be an indirect connection through an intermediate medium, or an internal communication between two components. For a person skilled in the art, the specific meanings of the aforementioned terms in the present invention may be understood based on specific circumstances.

Embodiment I

As shown in FIGS. 1-11, the present invention describes a storage device for carrying a storage box 2 for storing a portable electronic device. The portable electronic device according to the present invention may include, but is not limited to, a Bluetooth headset, a smart ring, an electronic bracelet, an electronic watch, etc. and in particular, the storage device for carrying the storage box 2 according to the present invention is described in detail by taking the Bluetooth headset as an example.

The storage device mainly includes a compartment body 1 and a storage box 2. The compartment body 1 includes an upper housing 11 and a lower housing 12, preferably hingedly connected, which can be opened or closed relative to each other, the upper housing 11 being reversibly opened or closed relative to the lower housing 12. The lower housing 12 includes a base outer shell 121 and a base inner shell 122, where the base inner shell 122 is formed with a recess 1211 for storing the portable electronic device (it should be noted here that the number of recesses 1211 can be one, two or more, for example, when the number of recesses 1211 is two, two left and right Bluetooth headsets can be stored), and the shape of the recess 1211 matches the shape of the portable electronic device; when the upper housing 11 and the lower housing 12 are closed, the electronic product is located between the base inner shell 122 and the upper housing 11, and at this time, the space between the base inner shell 122 and the upper housing 11 forms an accommodating cavity for placing an electronic product.

A base housing trim 123 is further provided between the base outer shell 121 and the base inner shell 122, the base inner shell 122 is snapped to the base outer shell 121 via the base housing trim 123, and the control main board 31 can be provided between the base housing trim 123 and the base inner shell 122, so that the mounting position of the control main board 31 is more reasonable.

The lower housing 12 is formed with an open-ended storage cavity 124 for placing the storage box 2; when the storage box 2 is completely placed in the storage cavity 124, it is preferable that the exposed portion of the storage box 2 matches the shape of the open end of the lower housing 12; and when the storage box main body 21 is located inside the cavity, the storage box 2 and the compartment body 1 assume a similar integrated shape, and the outer surfaces of the two are in a smooth transition linear shape, so that the overall shape of the whole storage device is consistent, beautiful and unobtrusive, thereby further improving the concealment of the storage box 2.

A lower surface of the base outer shell 121 may have a plurality of support foot pads 125 provided adjacent to the edges of the lower surface of the base outer shell 121, so that the base outer shell 121 and the table top do not scrape when the application is placed on the table top.

A self-locking mechanism 4 is provided between the storage box 2 and the compartment body 1; when the storage box 2 is placed in the cavity, the self-locking mechanism 4 locks the compartment body 1 and the storage box 2; and when the self-locking mechanism 4 unlocks, the storage box 2 can extend out of the cavity of the electronic product storage box 2.

The self-locking mechanism 4 includes a self-locking buckle 41 and a buckle structure 42 that can interlock or unlock with each other, the buckle structure 42 is provided on the storage box 2, the self-locking buckle 41 has one end fixedly mounted on the base outer shell 121 as a fixed end and the other end as a free end; the buckle structure 42 is provided with a hanging buckle protrusion 421, the free end and the hanging buckle protrusion can be engaged or disengaged with each other, and an energy storage spring 43 is connected to the self-locking buckle 41; and when the self-locking buckle 41 and the buckle structure 42 are in a box-locked state, the energy storage spring 43 is pressed by the buckle structure 42 to be in a compressed state.

The self-locking mechanism 4 may be provided between the storage box 2 and the base outer shell 121, or may be provided between the base outer shell 121 and the base housing trim 123, and the self-locking mechanism 4 is provided at different positions, and relevant structures should be appropriately adjusted. For example, a recess 1211 is provided on the base outer shell 121 or the base housing trim 123, a ball with a spring is provided at the position corresponding to the recess 1211 of the storage box 2, and when the position of the ball of the storage box 2 just corresponds to the position corresponding to the recess 1211, the ball is inserted into the recess 1211 to achieve positioning, and the storage box 2 can be pulled with sufficient force to disengage the ball from the recess 1211.

The storage box 2 includes a storage box main body 21, at least one partition plate 22 provided in the storage box main body 21, and at least one cover plate 23 for fitting the storage box main body 21 to form a closed space. The partition plates 22 are used for forming the storage box main body 21 into two or more storage areas 24, thereby being able to facilitate the storage of various articles or different types of medicines; the cover plate 23 cooperates with the storage box main body 21 to form an airtight space, whereby the sealability and moisture resistance of the storage box 2 can be improved. The partition plates 22 may be configured in quantity and shape according to user requirements. For example, the partition plates 22 may include multiple units or adopt integral shapes such as "Y"-type, "T"-type, or "bow"-type configurations.

The number of the cover plates 23 may correspond to the number of the storage spaces formed by the partition plates 22 and the storage box main body 21. The cover plate 23 and the storage box main body 21 can be connected via a rotary shaft mechanism or hinge, and the cover plate 23 can be engaged with the storage box main body 21. Thus, it is possible to facilitate the user to open the cover plate 23 to access the article.

The storage box 2 is preferably a medicine box, and the upper surface of the cover plate 23 may also be provided with marks for distinguishing a medicine storage area, such as characters, letters, numbers, combinations thereof and the like. A spoon 25 for taking medicine may also be fitted in the storage box 2.

The partition plate 22 includes a plurality of medicine box partition plates 22 that are freely combinable to form a plurality of different medicine storage areas, thereby reducing the number of medicine storage areas or the lack of flexibility in partitioning caused by the fixed storage mode or the general storage mode of the medicine box partition plates 22, i.e., providing a medicine box housing 22 in which the medicine storage areas can be freely combined or partitioned and more medicine storage areas can be combined.

The storage box main body 21 is provided at a position corresponding to the medicine box partition plate 22 with a clamping portion 221 for the medicine box partition plate 22 to be inserted, pulled and clamped, and the clamping portion 221 is a protrusion or a recessed slot. In this case, the medicine box partition plate 22 can be stabilized, whereby the stability of the medicine storage area division of the medicine box can be improved.

The plate surface of the medicine box partition plate 22 has at least one engagement portion for fixing another medicine box partition plate 22, the engagement portion being a protrusion or a recess. In this case, different medicine box partition plates 22 can be interconnected through engagement portions, and may be freely combined according to the quantity of medications to form partition plates 22 of varying shapes, thereby enhancing the flexibility of medicine storage area partitioning within the medicine box.

Figure 9:
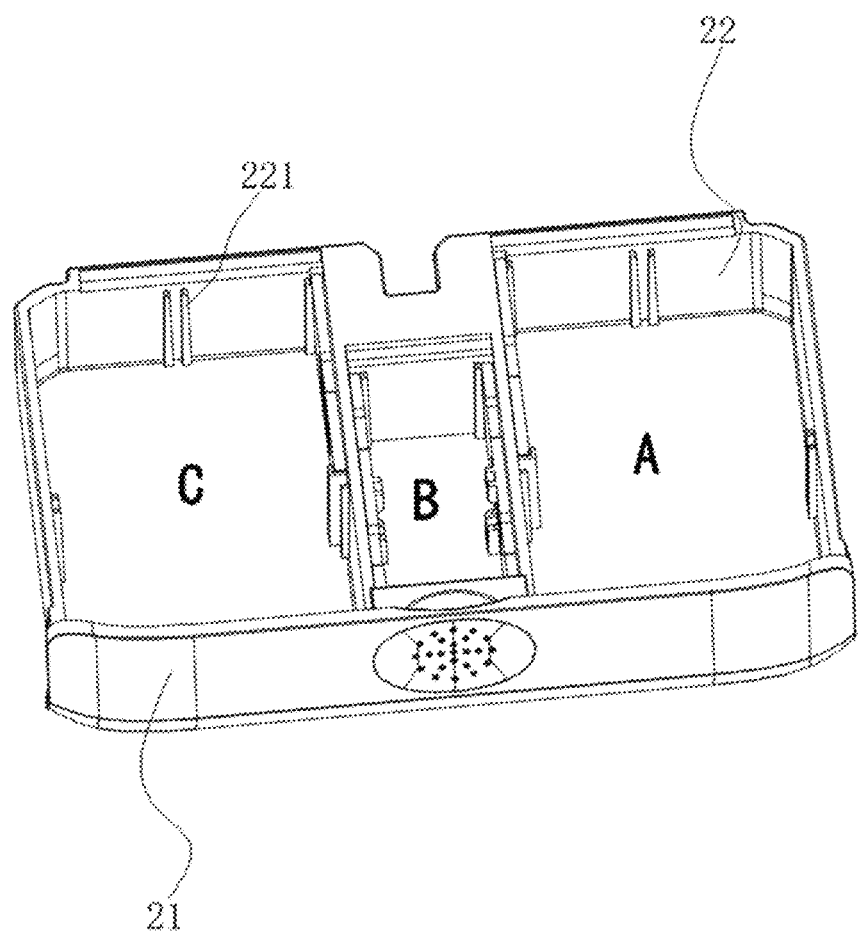
FIG. 9 is a schematic diagram showing a first example of a medicine box divided with medicine storage areas.
Figure 10:
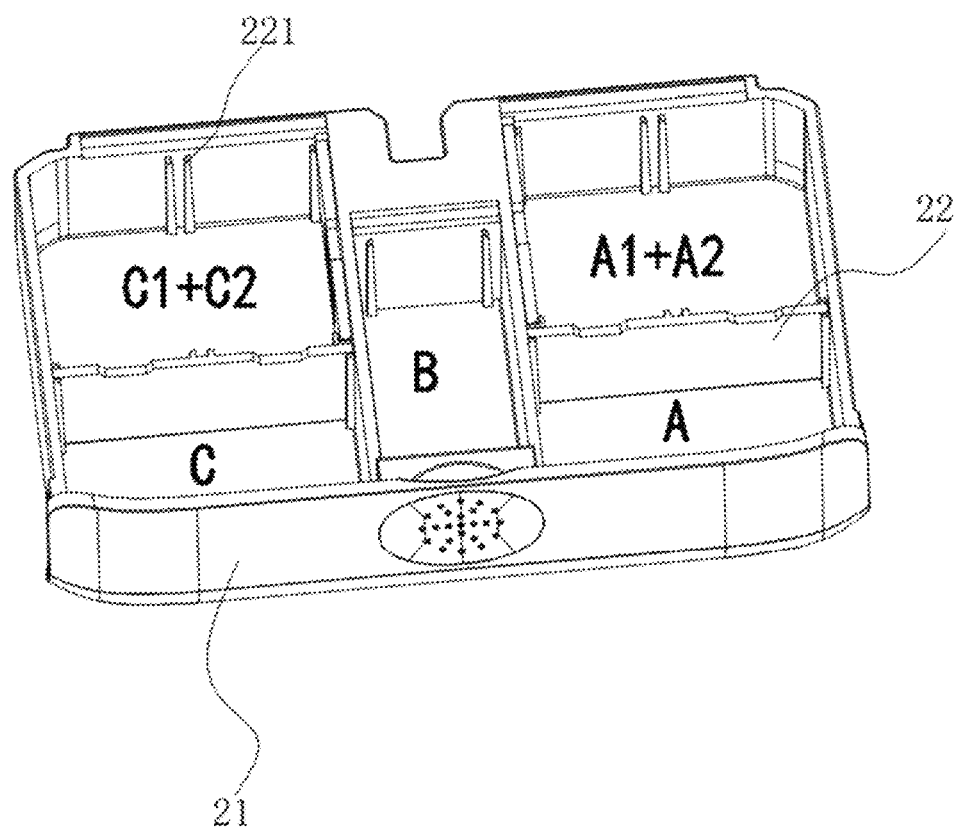
FIG. 10 is a schematic diagram showing a second example of a medicine box divided with medicine storage areas.
Figure 11:
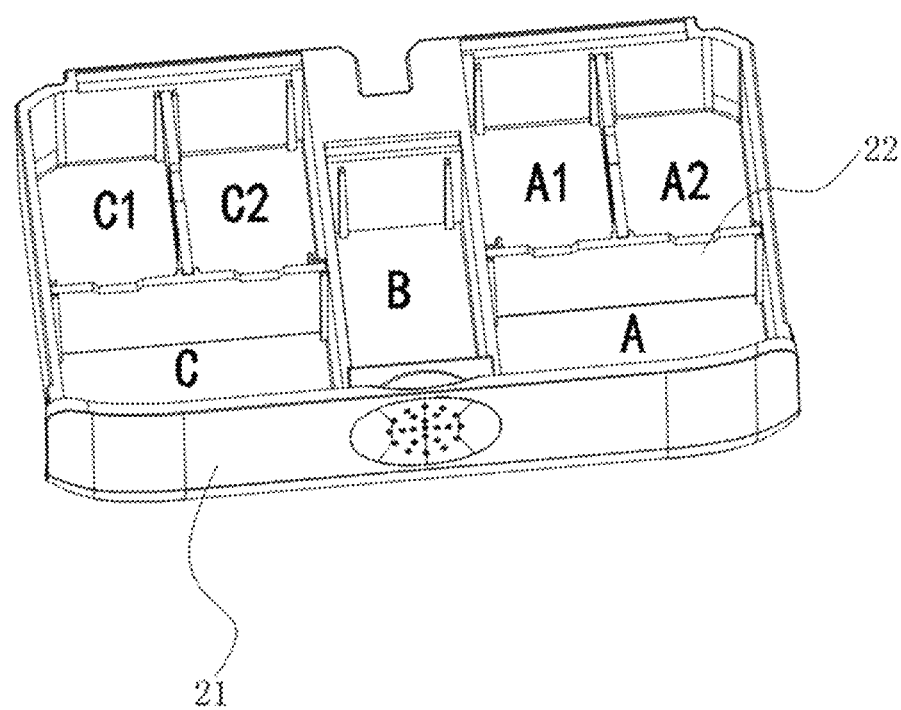
FIG. 11 is a schematic diagram showing a third example of a medicine box divided with medicine storage areas.
Figure 12:
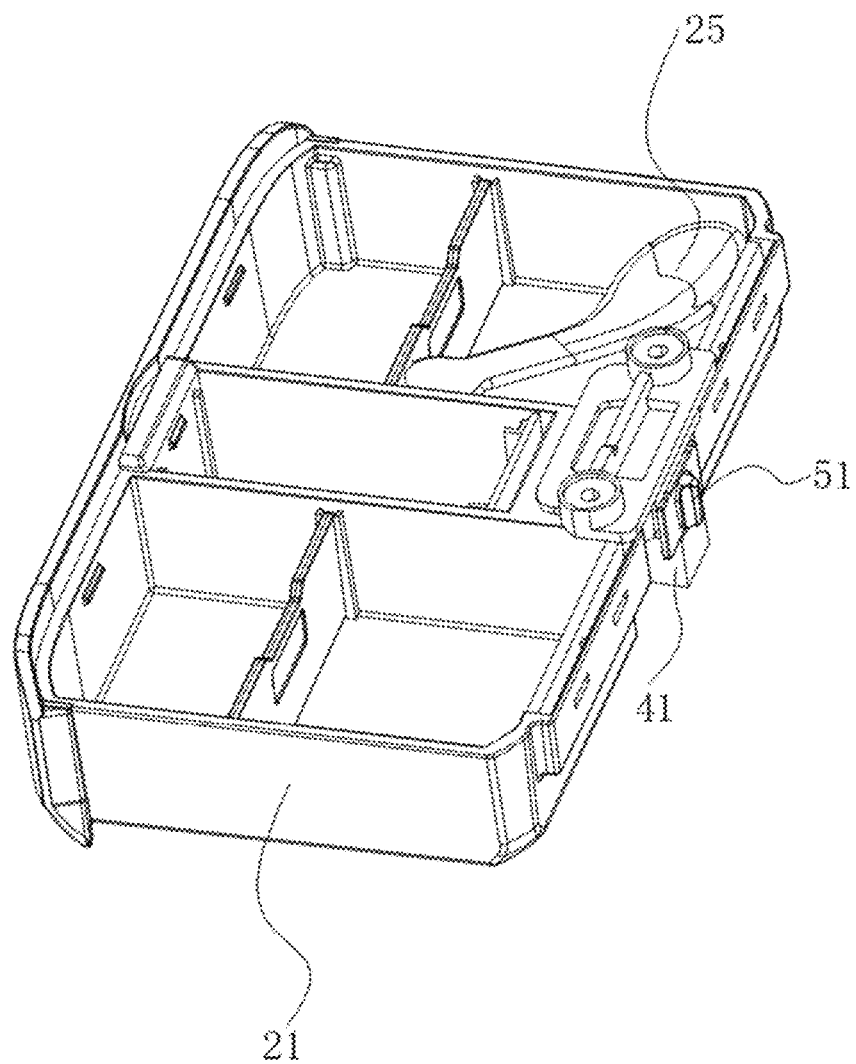
FIG. 12 is a schematic structural diagram showing a second storage box (with a mechanical locking structure)
Figure 13:
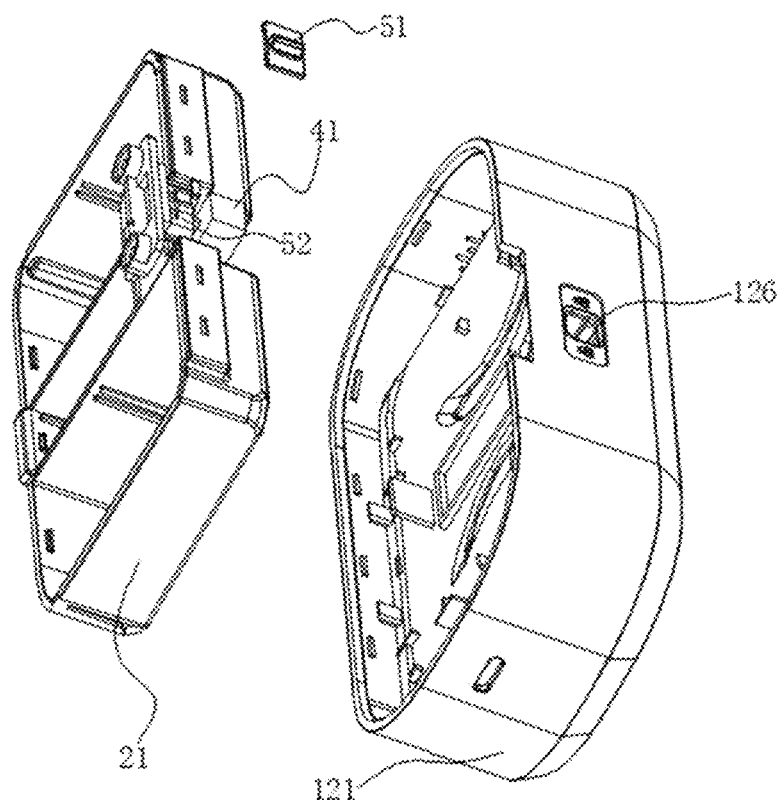
FIG. 13 is a structural exploded view showing a storage box and a lower housing with a mechanical locking structure.
Figure 14:
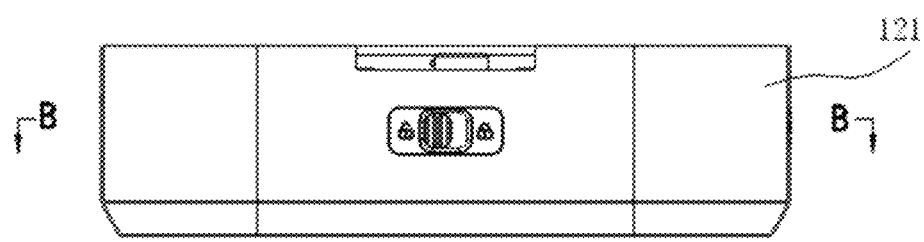
FIG. 14 is a schematic structural diagram showing a lower housing (in this case, a second storage box is mounted inside)
Figure 15:
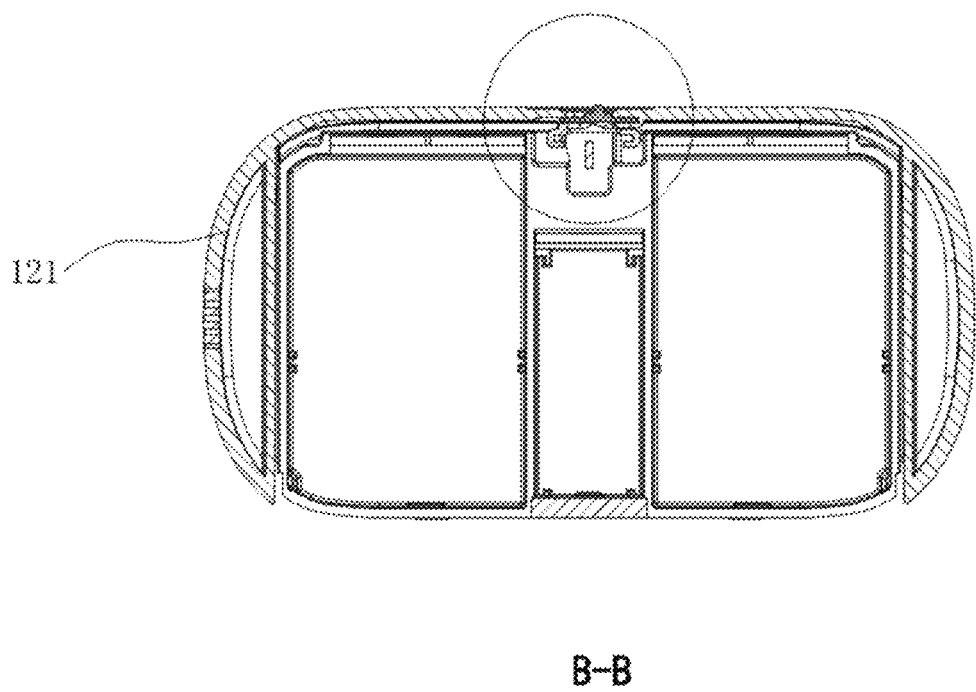
FIG. 15 is a sectional view taken along a line B-B of FIG. 14.
Figure 16:
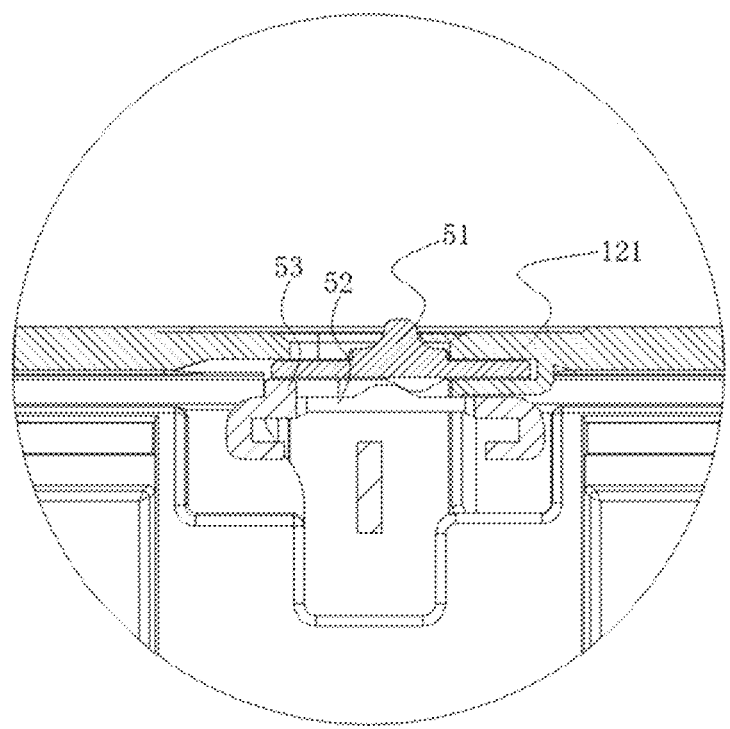
FIG. 16 is an enlarged view showing a portion C of FIG. 15.

For example, as shown in FIG. 9, the storage box main body 21 has three medicine storage areas A, B, and C when the medicine box partition plate 22 is not used. As shown in FIG. 10, the medicine box housing 22 can be divided into medicine storage areas A, A1+A2, B, C, and C1+C2 by a first medicine box partition plate 22 and a second medicine box partition plate 22, and as shown in FIG. 11, the medicine box housing 22 can be divided into medicine storage areas A, A1, A2, B, C, C1, and C by two first medicine box partition plates 22 and two second medicine box partition plates 22.

The lower housing 12 is provided with a control main board 32 with a Hall switch 35, the storage box 2 is provided with a magnetic element, the cover plate 23 can be used for hiding the magnetic element, the Hall switch 35 on the control main board 32 senses proximity or separation of the magnetic element, and outputs a low level or a high level for judging a state of whether the storage box 2 is inserted into or removed from the cavity;

the compartment body 1 is provided with a display screen 33 (it needs to be explained here that the display screen 33 can be provided on the upper housing 11, the base outer shell 121 or the base inner shell 122, and in order to make the layout more reasonable and facilitate wiring, the display screen 33 is preferably provided on the base inner shell 122 and on the side facing the upper housing 11), and the display screen 33 and the control main board 32 are electrically connected to display whether the storage box 2 and the lower housing 12 are in a locked state or an unlocked state.

The upper housing 11 or the lower housing 12 is further provided with a control main board 31 (it needs to be explained here that the control main board 31 and the control main board 32 can be one control main board 32, and are also different control main boards 32 which can be separately provided, and in order to make the structure more compact and the volume of the whole product smaller, it is preferable that the two are the same control main board 32); the control main board 31 is provided with a main control module, a charging management module for supplying power to the electronic product, a signal transmission and reception module, and is provided with an electric quantity detection module, a buzzer, a vibration motor, an LED lamp, a key, and a display screen 33; one or any combination of the accumulators 34 (it should be noted here that in order to provide a user with a more portable and smart user experience, it is preferable that the above components are all provided on the control main board 31).

The high-level or low-level signal output by the Hall switch 35 is transmitted to the signal transmitting and receiving module, and then occurs to the main control module via the signal transmission and reception module, and the main control module controls the display screen 33 to display the unlocking or locking state of the storage box 2;

the electric quantity detection module is electrically connected to the accumulator 34, the electric quantity detection module is electrically connected to the signal transmission and reception module, the electric quantity detection module transmits the detected electric quantity signal to the signal transmission and reception module, and then generates same to the main control module via the signal transmission and reception module, and the main control module controls the remaining electric quantity of the accumulator 34 of the display screen 33;

the buzzer and vibration motor are electrically connected to the main control module. The main control module is preprogrammed with software such that when specific conditions are triggered, the buzzer emits sound and/or the vibration motor activates and/or the LED indicator illuminates. For example, with an electronic alarm clock program preset in the main control module, upon reaching a predetermined time, the buzzer emits sound and/or the vibration motor activates and/or the LED indicator illuminates to remind the user to take medication;

the buttons may be configured to allow user control for deactivating operations such as buzzer sound emission, and/or vibration motor activation, and/or LED indicator illumination, or may be configured for user operations like adjusting alarm clock settings.

The foregoing descriptions regarding how to implement electrical signal connections, select main control modules, configure relevant software programs, and establish connections are known to those skilled in the art. As these technical details do not constitute the core inventive content of the present invention, they are therefore not elaborated herein.

Embodiment II

Different from Embodiment I, the storage box 2 is provided with a control main board 32 with a Hall switch 35, the lower housing 12 is provided with a magnetic element, and the Hall switch 35 on the control main board 32 senses proximity or separation of the magnetic element, and outputs a low level or a high level for judging a state of whether the storage box 2 is inserted into or removed from the cavity.

Embodiment III

Different from Embodiment I, the control main board 32 is further provided with a second Hall switch 35 for detecting the opening or closing of the upper housing 11, a second magnet is mounted on the upper housing 11 for sensing with the second Hall switch 35, and the main control module of the second Hall switch 35 sends a high/low level to confirm whether the upper housing 11 is in an open or closed state. When the second Hall switch 35 sends a low level to the main control module, the upper housing 11 is in a closed state, and when the Hall switch 35 sends a high level to the main control module, the upper housing 11 is in an open state.

The main control module may be programmed with software such that when the upper housing 11 is opened or the storage box 2 is unlocked, relevant signals are output through buzzer sound emission and/or vibration motor activation and/or LED indicator illumination. This configuration facilitates usage by hearing-impaired or visually impaired users while maintaining practical functionality. In the present invention, control management of the storage box 2 may include, but is not limited to, medication schedule configuration, medication time reminders, dosage prompts, and medication type notifications. The storage box 2 may also carry personal items such as keys, rings, and earrings.

Embodiment IV

Differing from Embodiment I, the control main board is provided with a Bluetooth module and/or NFC module, where the Bluetooth module and/or NFC module are electrically connected to a signal transmission and reception module. The Bluetooth module and/or NFC module may establish electrical signal connections with external terminal devices including mobile phones, tablets, and laptops. Through applications (APP), H5 pages, or web pages on these terminal devices, the storage device can be controlled, for instance, setting alarms, configuring medication compartment dosages, or deactivating the buzzer/vibration motor/LED indicators.

Embodiment V

As shown in FIGS. 12-16, different from Embodiment I, a mechanical locking structure for preventing accidental opening of the self-locking mechanism 4 is provided between the self-locking buckle 41 and the storage box main body 21, and the mechanical locking structure includes a push button 51, and a linkage 52 connected to the push button 51 in a linkage manner, the linkage 52 is provided with an abutment portion 53 capable of forming an abutment connection with the storage box main body 21 following sliding movement of the push button 51, and the base outer shell 121 is provided with a push button mounting hole 126, and the push button 51 is provided in the push button mounting hole 126.

By pushing the push button 51, the push button 51 drives the linkage 52 to move 52 until the linkage 52 forms an abutment connection with the storage box main body 21, and at this time, when the storage box main body 21 is pressed, the free end cannot be separated from the hanging buckle protrusion, thereby preventing the storage box main body 21 from being opened due to the storage box main body 21 being accidentally pressed.

If it is necessary to unlock the self-locking mechanism 4, it is only necessary to move the push button 51 to drive the linkage 52 out of the abutment connection with the storage box main body 21.

The foregoing descriptions regarding how to achieve electrical signal connections and configure relevant software programs are known to a person skilled in the art. As these technical details do not constitute the core inventive content of the present invention, they are therefore not elaborated herein.

The embodiments described above are merely preferred implementations of the present invention and shall not be used to limit the scope of protection. Any non-substantial variations and modifications made by a person skilled in the art based on the present invention shall fall within the protection scope of the invention.

The invention claimed is:

1. An electronic product storage device with a storage box, comprising a compartment body for storing an electronic product and a storage box for storing articles, wherein the compartment body comprises an upper housing and a lower housing which can be opened or closed to each other, an accommodating cavity for placing the electronic product is formed between the upper housing and the lower housing, and the lower housing is formed with a storage cavity for placing the storage box;

a self-locking mechanism is provided between the storage box and the compartment body, and when the storage box is placed in the cavity, the self-locking mechanism locks the compartment body and the storage box, and when the self-locking mechanism is unlocked, the storage box can extend out of the cavity of the electronic product storage box;

the lower housing is provided with a control main board with a Hall switch, the storage box is provided with a magnetic element, the Hall switch on the control main board senses proximity or separation of the magnetic element, and outputs a low level or a high level for judging a state of whether the storage box is inserted into or removed from the cavity;

or, the storage box is provided with a control main board with a Hall switch, the lower housing is provided with a magnetic element, the Hall switch on the control main board senses proximity or separation of the magnetic element, and outputs a low level or a high level for judging a state of whether the storage box is inserted into or removed from the cavity.

2. The electronic product storage device with a storage box according to claim 1, wherein the lower housing comprises a base outer shell and a base inner shell, the accommodating cavity is located between the base inner shell and the upper housing, the storage cavity is located in the base outer shell and located below the base inner shell, and the self-locking mechanism is located between the base outer shell and the storage box.

3. The electronic product storage device with a storage box according to claim 1, wherein the self-locking mechanism comprises a self-locking buckle and a buckle structure that can interlock or unlock with each other, the buckle structure is provided on the storage box, the self-locking buckle has one end fixedly mounted on the compartment body as a fixed end and the other end as a free end, the buckle structure is provided with a hanging buckle protrusion, the free end and the hanging buckle protrusion can be engaged or disengaged with each other, and an energy storage spring is connected to the self-locking buckle, and when the self-locking buckle and the buckle structure are in a box-locked state, the energy storage spring is pressed by the buckle structure to be in a compressed state.

4. The electronic product storage device with a storage box according to claim 1, wherein the storage box or/and the compartment body are provided with a display screen, and the display screen and the control main board are electrically connected to display whether the storage box and the lower housing are in a locked state or an unlocked state.

5. The electronic product storage device with a storage box according to claim 1, wherein the control main board is provided with a main control module, a charging management module for supplying power to the electronic product, a signal transmission and reception module, and is provided with one or any combination of an electric quantity detection module, a buzzer, a vibration motor, an LED lamp, a button, a display screen, and an accumulator.

6. The electronic product storage device with a storage box according to claim 5, wherein the control main board is provided with a Bluetooth module or/and an NFC module, and the Bluetooth module or/and the NFC module are electrically connected to the signal transmission and reception module.

7. The electronic product storage device with a storage box according to claim 2, wherein the base inner shell is formed with a recess for storing a portable electronic device, and a shape of the recess matches a shape of the portable electronic device.

8. The electronic product storage device with a storage box according to claim 1, wherein the storage box is a medicine box, the medicine box comprises an open-ended medicine box housing, the medicine box housing is formed with a medicine storage module, a medicine box partition plate detachably connected to the medicine box housing is provided inside the medicine storage module, and the medicine box partition plate divides a space inside the medicine storage module into at least two different medicine storage areas.

9. The electronic product storage device with a storage box according to claim 8, wherein the medicine storage module comprises a first medicine storage module and a second medicine storage module, the medicine box partition plate comprises a first medicine box partition plate dividing the first medicine storage module into at least two medicine storage areas, and a second medicine box partition plate dividing the second medicine storage module into at least two medicine storage areas; and an intermediate area is also provided between the first medicine storage module and the second medicine storage module and can be used for placing a medicine or medicine box partition plate.

10. The electronic product storage device with a storage box according to claim 3, wherein a mechanical locking structure for preventing accidental opening of the self-locking mechanism is provided between the self-locking buckle and the storage box main body, and the mechanical locking structure comprises a push button, and a linkage connected to the push button in a linkage manner, the linkage is provided with an abutment portion capable of forming an abutment connection with the storage box main body following sliding movement of the push button, and the base outer shell is provided with a push button mounting hole, and the push button is provided in the push button mounting hole.

* * * * *